(12) United States Patent
Kasai (10) Patent No.: US 7,306,695 B2
(45) Date of Patent: Dec. 11, 2007

(54) APPARATUS AND METHOD FOR PICKING UP SEMICONDUCTOR CHIP (75) Inventor: Teruaki Kasai, Chikushino (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 371 days.

(21) Appl. No.: 10/820,293

(22) Filed: Apr. 8, 2004

(65) Prior Publication Data
US 2004/0238117 A1 Dec. 2, 2004

(30) Foreign Application Priority Data
Apr. 10, 2003 (JP) .................. P 2003-106414

(51) Int. Cl.
B32B 38/10 (2006.01)
H01L 21/46 (2006.01)
(52) U.S. Cl. .............. 156/344; 156/584; 438/464; 438/976
(58) Field of Classification Search ........ 438/464, 438/976; 156/344, 584
See application file for complete search history.

(56) References Cited

U.S. PATENT DOCUMENTS

| | | | |
|---|---|---|---|
| 4,667,944 A | 5/1987 | Althouse | |
| 5,976,306 A * | 11/1999 | Davis et al. ............ | 156/344 |
| 6,032,715 A | 3/2000 | Ohkubo et al. | |
| 6,709,543 B2 * | 3/2004 | Kurosawa ............... | 156/344 |
| 6,773,543 B2 * | 8/2004 | Summers ............... | 156/344 |
| 7,060,593 B2 * | 6/2006 | Kurosawa et al. ...... | 438/464 |
| 2002/0026931 A1 | 3/2002 | Kurosawa et al. | |
| 2003/0060021 A1 | 3/2003 | Kurosawa et al. | |
| 2004/0038498 A1 | 2/2004 | Ozono et al. | |
| 2005/0003636 A1 * | 1/2005 | Takyu et al. ............ | 438/464 |
| 2005/0255673 A1 * | 11/2005 | Cheung et al. ......... | 438/460 |

FOREIGN PATENT DOCUMENTS

| | | |
|---|---|---|
| EP | 1 209 724 A2 | 5/2002 |
| JP | 54-58356 | 5/1979 |
| JP | 05-335405 | 12/1993 |
| JP | 06-061347 | 3/1994 |
| JP | 10-163133 | 6/1998 |
| JP | 11-274181 | 10/1999 |

* cited by examiner

Primary Examiner—Mark A Osele
(74) Attorney, Agent, or Firm—Pearne & Gordon LLP

(57) ABSTRACT

A semiconductor chip pick-up apparatus includes: a pick-up head for picking up the chip on a sheet; a holding table for holding the sheet; a recognition means for recognizing the chip; a positioning means for positioning the chip relatively to the pick-up head on the basis of the recognition result by the recognition means; and a sheet separating mechanism for separating the sheet from the chip by sucking the sheet from a suction plane brought in contact with a lower surface of the sheet. The sheet separating mechanism includes: a plurality of sucking grooves formed in the suction plane; a plurality of boundary zones, each of which separates the sucking grooves adjacent to each other and supports the sheet in their contact with the lower surface of the sheet during sucking; suction members movably arranged in the sucking grooves, respectively so that when they are moved toward lower surface of the sheet, they are brought into contact with the lower surface of the sheet to suck the sheet; a moving means for moving the suction members; and a sucking means for sucking the sheet from said plurality of sucking grooves.

4 Claims, 8 Drawing Sheets

APPARATUS AND METHOD FOR PICKING UP SEMICONDUCTOR CHIP

BACKGROUND OF THE INVENTION

The present invention relates to an apparatus for picking up a semiconductor chip adhered on a sheet cut from a wafer and a method for picking up the same.

A semiconductor chip has a tendency of being low-profiled with recent downsizing of electronic components, and a very low-profiled semiconductor device having a thickness of 100 µm or less has been put into practice. However, such a low-profiled semiconductor device is apt to be damaged and so difficult to handle. Particularly, it is very difficult to execute a process of taking out an individual semiconductor chip cut from a wafer. This process repeatedly implements the operation of picking up the semiconductor chip adhered on a sheet using an suction nozzle while being separated for each piece. In this case, if the method for separating a semiconductor chip, which has been conventionally used, is adopted for the low-profiled semiconductor chip (see Patent Publication JP-A-54-58356), i.e. pushing up the semiconductor chip by a needle from below the sheet is adopted, inconveniences such as fracture or chipping in the semiconductor chip may be generated frequently.

In the case where the above method is directed to the low-profiled chip, in many cases, the individual semiconductor chip remains warped/deformed in the state where the sheet has been sucked from below. Therefore, in imaging of the semiconductor chip for alignment during the pick-up, erroneous recognition due to the warping/deformation occurs very frequently. The erroneous recognition means that owing to a partial warp of the semiconductor chip, a conforming product is erroneously decided to be a defective product with chipping.

SUMMARY OF THE INVENTION

In such a circumstance, the present invention intends to provide an apparatus for picking up a semiconductor chip which is directed to a low-profile semiconductor chip and can prevent erroneous recognition, and a method of picking up the same.

According to first aspect of the invention, a chip pick-up apparatus, includes: a pick-up head for picking up a chip held on a sheet; a holding table for holding the sheet; a recognition means for recognizing the chip by capturing an image of the chip held on the sheet; a positioning means for positioning the chip to be picked up relatively to the pick-up head on the basis of the recognition result by the recognition means; and a sheet separating mechanism for separating the sheet from the chip by sucking the sheet from a suction plane brought in contact with a lower surface of the sheet, the sheet separating mechanism being arranged below the holding table, wherein the sheet separating mechanism includes: a plurality of sucking grooves formed in the suction plane; a plurality of boundary zones, each of which separates the sucking grooves adjacent to each other and supports the sheet in their contact with the lower surface of the sheet during sucking; suction members movably provided in the sucking grooves, respectively so that when they are moved toward the lower surface of the sheet, they are brought into contact with the lower surface of the sheet to suck the sheet; a moving means for moving the suction members; and a sucking means for sucking the sheet from the sucking grooves.

Preferably, the chip may be supported through the sheet by the boundary zones in a state where the suction members have left the surface of the sheet.

According to second aspect of the invention, a chip pick-up method for picking up a chip held on a sheet using a pick-up head, includes: a recognition step of recognizing the chip by capturing an image of the chip held on the sheet; a positioning step of positioning the chip to be picked up relatively to the pick-up head on the basis of the recognition result in the recognition step; a sheet separating step of separating the sheet from the chip by sucking the sheet from sucking grooves with boundary zones being kept in contact with a lower surface of the sheet; and a holding step of holding an upper surface of the chip separated from the sheet using the pick-up head, wherein prior to the recognition step, suction members are moved to be brought into contact with the lower surface of the sheet and the sheet is sucked so that the deformation of the chip held on the sheet is reformed.

Preferably, the sheet separating step may be implemented in a state where the suction members have left the lower surface of the sheet, and in the sheet separating step, the chip is supported through the sheet by the boundary zones each of which separates the sucking grooves adjacent to each other.

According to third aspect of the invention, a chip pick-up apparatus includes: a pick-up head for picking up a chip held on a sheet; a holding table for holding the sheet; a recognition means for recognizing the chip by capturing an image of the chip held on the sheet; a positioning means for positioning the chip to be picked up relatively to the pick-up head on the basis of the recognition result by the recognition means; and a sheet separating mechanism for separating the sheet from the chip by sucking the sheet from a suction plane brought in contact with the lower surface of the sheet, the sheet separating mechanism being arranged below the holding table, wherein the sheet separating mechanism includes: a reforming means for reforming deformation of the chip in contact with the lower surface of the sheet; and a separating means for separating the sheet from the chip by deforming the chip.

According to forth aspect of the invention, a chip pick-up method for picking up a chip held on a sheet using a pick-up head, includes: a recognition step of recognizing the chip by capturing an image of the chip held on the sheet; a positioning step of positioning the chip to be picked up relatively to the pick-up head on the basis of the recognition result in the recognition step; a sheet separating step of separating the sheet from the chip by sucking the sheet from sucking grooves, with boundary zones being kept in contact with a lower surface of the sheet; and a holding step of holding an upper surface of the chip separated from the sheet using the pick-up head, wherein prior to the recognition step, deformation of the chip held on the sheet is reformed, and in the sheet separating step, the chip is deformed to peel the sheet from the chip.

DETAILED DESCRIPTION OF THE PREFERRED EMBODIMENTS

Now referring to the drawings, an explanation will be given of an embodiment of the present invention.

Figure 1:
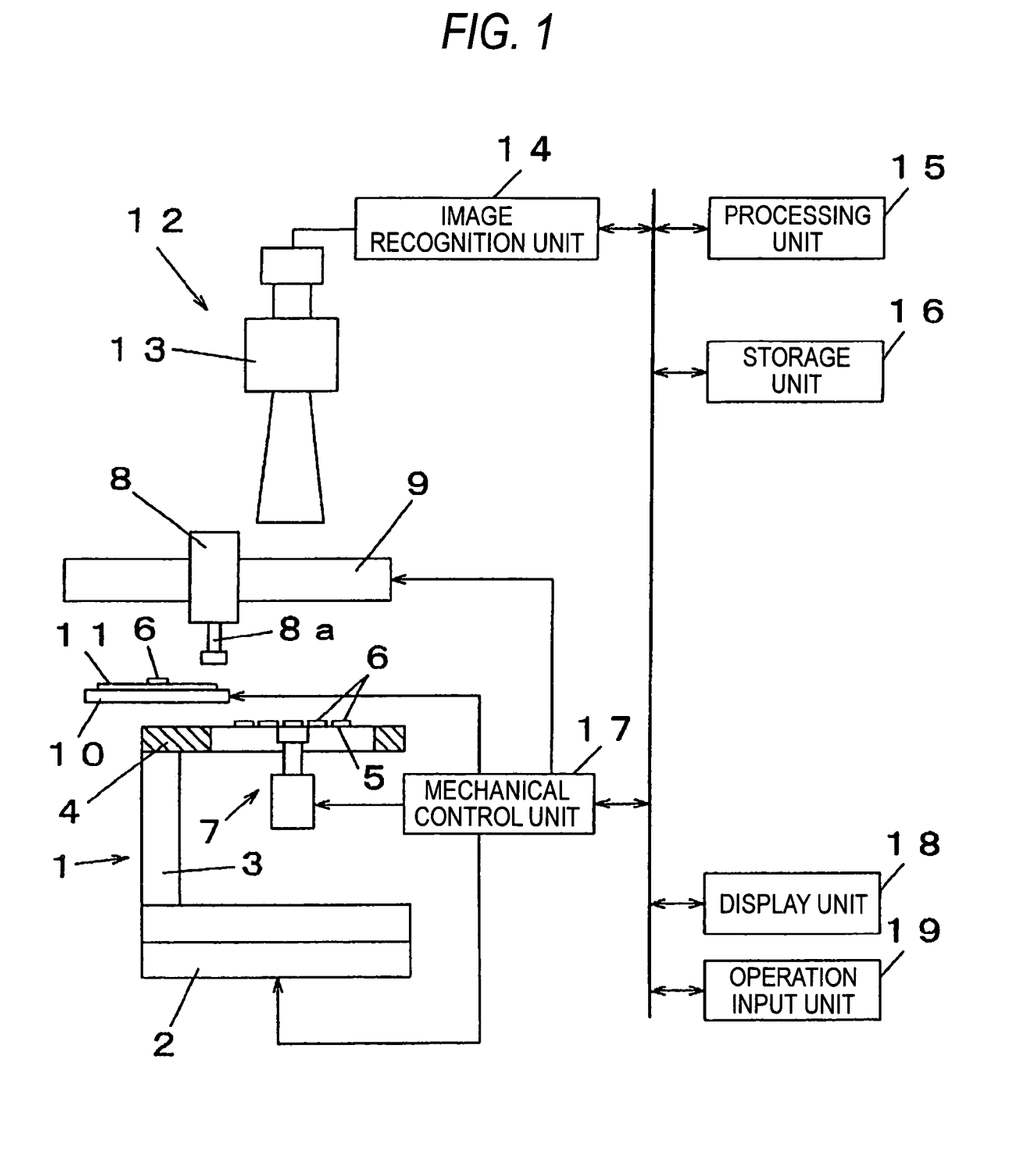
FIG. 1 is a block diagram of the configuration a semiconductor-chip picking-up apparatus according to an embodiment of this invention.

First, referring to FIG. 1, an explanation will be given of the configuration of a semiconductor chip used in the present invention. In FIG. 1, a chip supplying portion, generally 1 is designed in a structure in which a holding table 4 is connected onto a bracket 3 upstanding on an XY table 2. On the holding table 4, a sheet 5 is held on which a large number of semiconductor chips 6 (hereinafter simply referred to as chips 6) are adhered.

Now, the chip 6 is a low-profiled chip having a characteristic of small rigidity and flexibility. The sheet 5 is made of flexible silicone resin. The sheet 5, on which the chip 6 are adhered, is apt to easily warp together with the chip 6. In the separating operation described later, using this property of the sheet 5, the sheet 5 as well as the chips is warped so that the sheet 5 is separated from the lower surface of the chip 6.

Below the holding table 4, a sheet separating mechanism 7 is located. The sheet separating mechanism 7 has a suction plane for sucking the sheet 5 in its contact with the lower surface of the sheet 5. The sheet separating operation vacuum-sucks the sheet 5 from the suction plane so that the sheet 5 as well as the chip 6 is deformed.

Above the chip supplying portion 1, a pick-up head 8 mounted on a moving table 9 is located to be movable horizontally. The chip 6 from which the sheet 5 has been separated is picked up by a suction nozzle 8a of the pick-up head 8 through vacuum sucking. The chip 6 thus picked up is packaged on a substrate 11 placed on a substrate holding table 10 using the pick-up head 8 which is moved by the moving table 9.

Above the holding table 4, an imaging portion 12 equipped with a camera 13 is located. The imaging portion 12 captures an image of the chip 6 on the sheet 5. The image data acquired by capturing is transferred to an image recognition unit 14. The image recognition unit 14 image-processes the image data to detect the position of the chip 6. The imaging portion 12 and the image recognition unit 14 constitute a recognition means for recognizing the chip 6 held on the sheet 5 by capturing an image of the chip 6. A processing unit 15, which is a CPU, executes the program stored in a storage unit 16 to implement various operations and computations. Namely, the processing unit 15 receives the recognition result in the image recognition unit 14 and also controls the respective units described below.

The storage unit 16 serves to store the program necessary for the operation of the respective portions and various data inclusive of the size of the chip 6 to be recognized and arrangement data on the sheet 5. A mechanism control unit 17 serves to control the pick-up head 8 and moving table 9 for moving the pick-up head 8; sheet separating mechanism 7; and XY table 2. The XY table 2, holding table 4, moving table 9, processing unit 15 and mechanism control unit 17 constitute a positioning means for positioning the chip to be picked up relatively to the pick-up head on the basis of the recognition result by the recognition means. A display unit 18 serves to display the image of the chip 6 and a screen during operating/data inputting. An operating/inputting unit 19 is an input device such as a keyboard for operating/data inputting.

Figure 2:
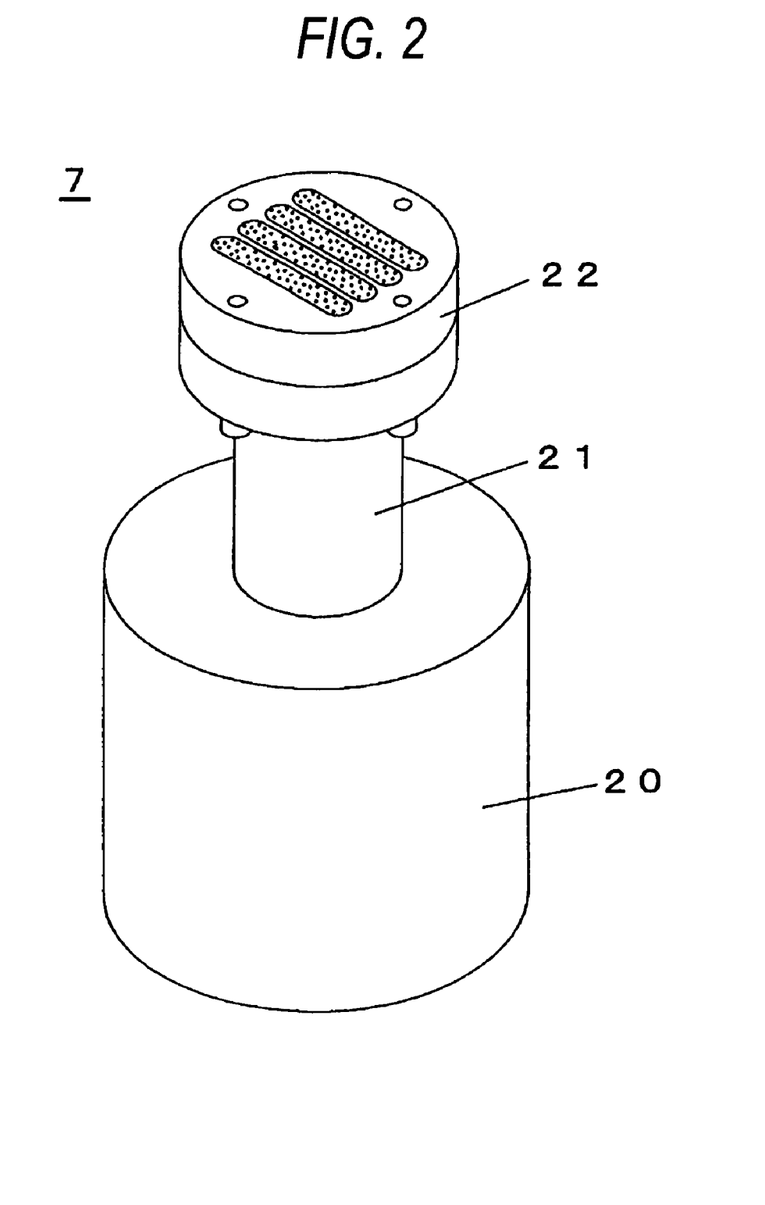
FIG. 2 is a perspective view of a sheet separating mechanism of a semiconductor-chip picking-up apparatus according to an embodiment of the present invention.
Figure 3:
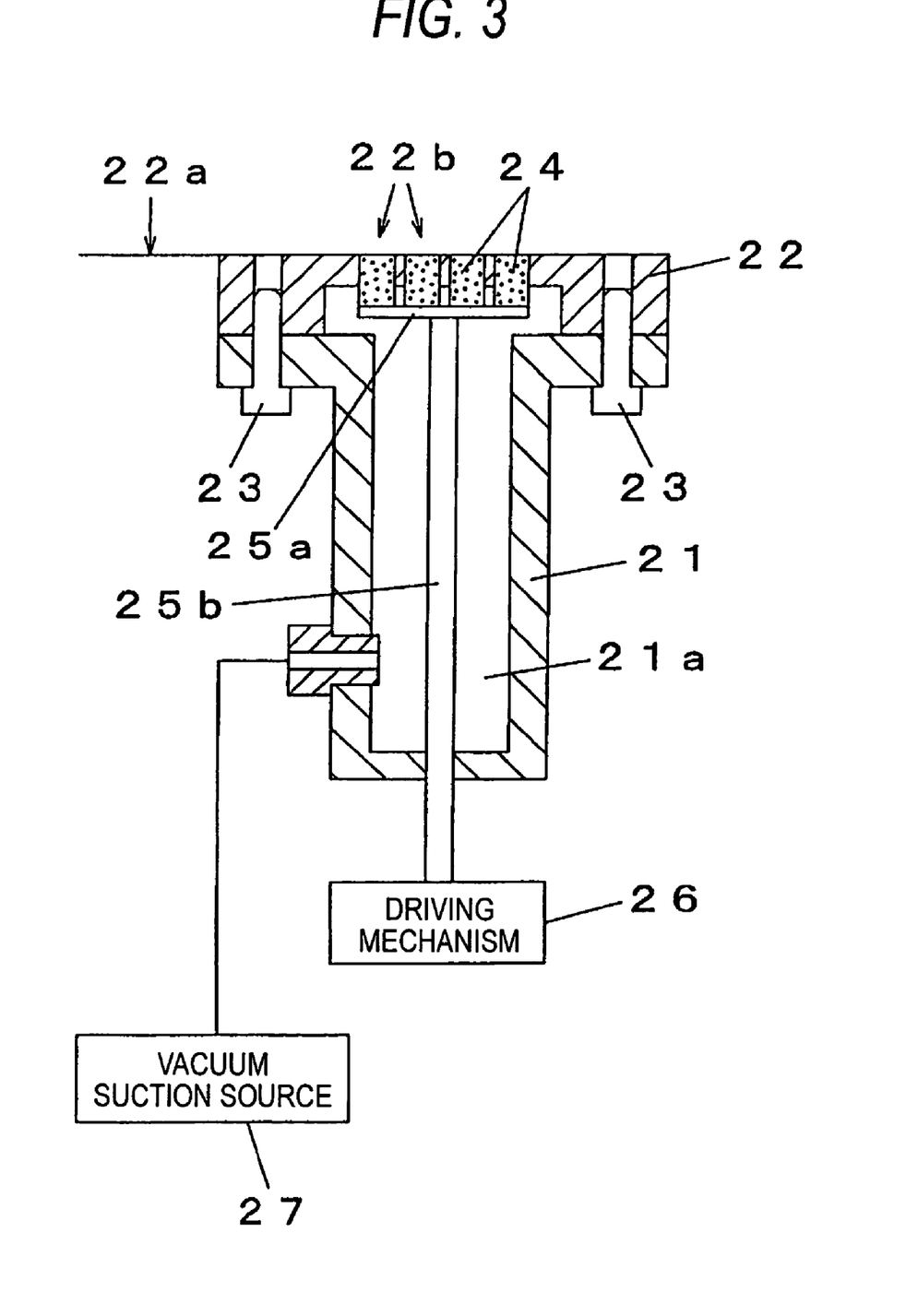
FIG. 3 is a partial sectional view of a sheet separating mechanism of a semiconductor-chip picking-up apparatus according to an embodiment of the present invention.

Next referring to FIGS. 2 and 3, an explanation will be given of the configuration of the sheet separating mechanism 7. As seen from FIG. 2, the sheet separating mechanism 7 includes a mechanism body 20, a supporting shaft portion 21 which is rotatably held on the mechanism body 20 and an suction separating tool 22. The suction separating tool 22 is prepared as a separate component according to the shape and size of an objective chip and exchangeably mounted onto the upper surface of the supporting shaft portion 21 through bolting holes 22e(FIGS. 4A and 4B) by bolts 23.

The upper surface of the suction separating tool 22 constitutes an suction plane 22a which vacuum-sucks the sheet 5 in its contact therewith. The suction plane 22a has a plurality of linear sucking grooves 22b which penetrate through the upper surface of the suction separating tool 22 to communicate with an inner hole 21a of the supporting shaft portion 21. Suction members 24 made of a porous material such as a sintering material having a larger number of pores are ascendably/descendably fit in the sucking grooves 22b, respectively. These suction members 24 are coupled at their lower ends by a coupling member 25a. The coupling member 25a is connected to a shaft member 25b which extends vertically downward.

By up and down driving the shaft 25b using a vertical driving mechanism 26, the suction members 24 ascend/descend in the sucking grooves 22, respectively. The vertical driving mechanism 26 and shaft 25b serves as a moving means for moving up and down the suction members 24. In the state where the shaft member 25b has been ascended, the upper surface of the suction members 24 is flush with the suction plane 22a. When the shaft 25b has been descended, at the upper portions of the sucking grooves 22b, concave portions concaved from the suction plane 22a are formed (FIG. 4B). In both up and down states, the lower surfaces of the suction members 24 are always exposed to the internal hole 21a.

The internal hole 21a of the supporting shaft portion 21 communicates with a vacuum suction source 27. By driving the vacuum suction source 27, the interior of the internal hole 21a is vacuum-sucked. Thus, the sucking grooves 22b communicating with the internal hole 21a are also vacuum-sucked. The vacuum suction source 27 serves as a sucking means for sucking from the sucking grooves 22b. Now, since the suction members 24 are fit or provided in the sucking grooves 22b, respectively, when the internal hole 21a is vacuum-sucked, pores opened in the lower surfaces of the suction members 24 are vacuum-sucked. This vacuum sucking reaches the internal pores of the suction member 24 so that the upper surfaces of the suction members 24 are also vacuum-sucked. In the state where the suction members 24 have been risen so that their upper surfaces are flush with the suction plane 22a and the suction plane 22a is in contact with the lower surface of the sheet 5, when the vacuum sucking source 27 is driven, the suction member 24 sucks the sheet 5.

A mechanism body 20 incorporates a rotation driving mechanism (not shown) so that the suction-separating tool 22 can be rotated around the vertical shaft by the rotating/driving mechanism. Therefore, the planar angle of the suction plane 22a of the suction-separating tool 22 around the vertical shaft can be set at any optional angle. Thus, as described later, the direction of the sucking grooves 22b can be set at a prescribed optimum angle to the suction separating operation relative to the one side of a square chip 6 to be separated. Incidentally, instead of rotating the suction-separating tool 22, the holding table 4 may be rotated by an angle of θ.

Figure 4A:
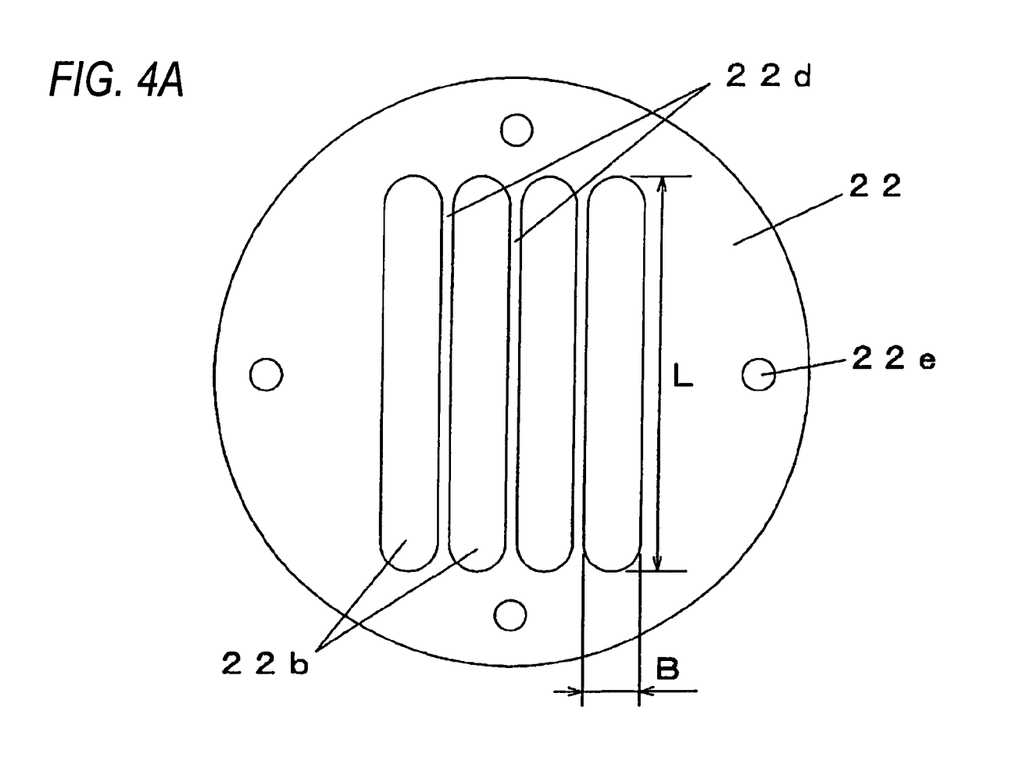
FIGS. 4A and 4B are views for explaining the shape of an suction/separating tool of a semiconductor-chip picking-up apparatus according to an embodiment of the present invention.
Figure 4B:
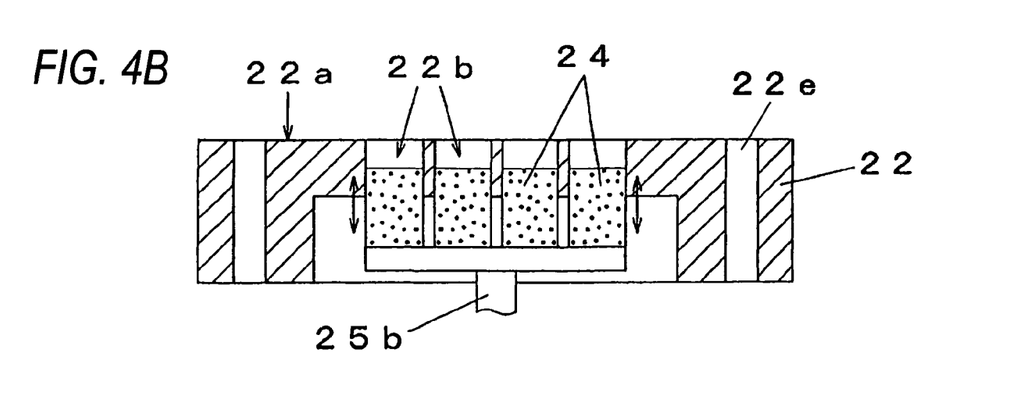

Referring to FIGS. 4A and 4B, an explanation will be given of the shape of the sucking grooves 22 formed in the suction plane 22a. As seen from FIG. 4A, four rows of sucking grooves 22b each having a width of B and a length of L are formed. The adjacent sucking grooves are separated from each other by one of boundary zones 22d. No protrusion is provided within each of the sucking grooves 22b so that the warping/deformation of the sheet 5 when the sheet is sucked is not hindered.

The width B and length L of the sucking groove 22b and the number of the sucking grooves 22b to be arranged are set according to the size of the objective chip 6. In the state where the suction plane 22a is kept in contact with the lower surface of the sheet 5, the width B of the sucking groove 22d and the positional relationship between the suction plane 22a and the chip 6 are set so that the range covering the single chip 6 is sucked through the plurality of sucking grooves 22b and the end of the chip 6 is not located immediately above the boundary zone 22d (see FIGS. 5A and 5B).

In the vacuum sucking by the suction plane 22a, since the boundary zones 22d are flush with the suction plane 22a, the upper surface of the plurality of boundary zones 22d separating the plurality of sucking grooves 22b is brought into contact with the lower surface of the sheet 5 to supports it from below. Thus, the chip 6 is also supported through the sheet 5 by the plurality of boundary zones 22d so that the posture of the chip 6 is held horizontally during the suction process.

By performing the vacuum sucking in this state, as described later, the chip 6 adhered on the sheet 5 is warped/deformed together with the sheet 5 so that the sheet 5 is separated from the lower surface of the chip 6. Incidentally, the boundary zone 22 is not required to be continuous to separate the sucking grooves 22b completely from one another, but may be formed in a discontinuous shape with breaks on the way. Further, pillar-like dividing portions the upper surface of which is flush with the suction plane 22a may be provided in a dot-sequential arrangement.

The semiconductor-chip picking up apparatus according to the present invention is configured as described above. Next, an explanation will be given of the semiconductor-chip picking up method using this picking up apparatus. The explanation will be given of the case where the chip held on the sheet 5 is a low-profile type which is likely to be warped.

Figure 6A:
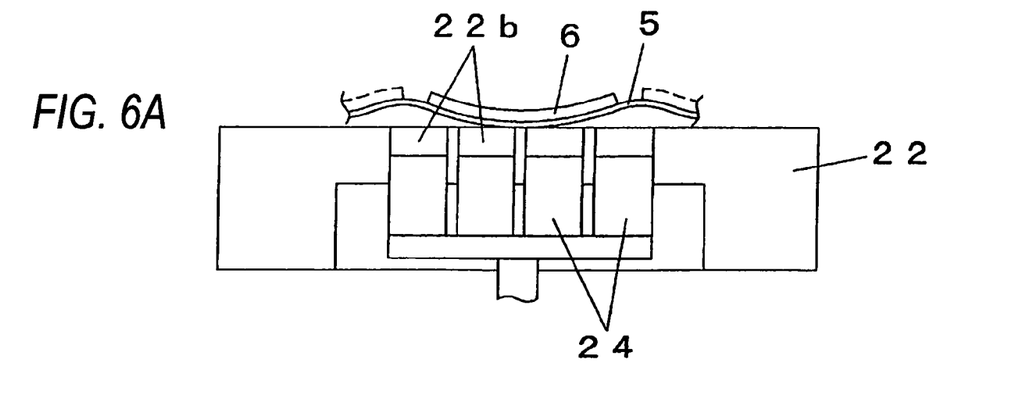
FIGS. 6A and 6B are views for explaining the operation of a semiconductor-chip picking-up method according to an embodiment of the present invention.

The semiconductor chip becomes likely to be deformed as with a reduction in the thickness. Particularly, the semiconductor chip has a tendency of such warping as to be rolled up at four diagonal corners (see FIG. 6A). If the operation of picking up is performed for the chip 6 in the warped/deformed state, the following inconvenience is prone to occur in the image recognition by a camera 13 for locating the chip 6 at a position for extraction by a suction nozzle 8a.

The image recognition of the chip 6 distinguishes the chip 6 from a surrounding background on the basis of the luminance difference on the image taken by the camera. This imaging is carried out in such a manner that illuminating light projected from above is reflected from the upper face of the chip 6 to enter the camera. In this case, if the degree of planarity of the chip 6 to be imaged is poor, the light reflected from the chip 6 is not uniform so that the light reflected from the warped portion may not normally enter the camera 13.

Therefore, on the image acquired by imaging, the four diagonal corners having suffered from warping have a tendency of appearing as low luminance areas. As a result, if the image processing for chip recognition is performed on the basis of the image thus acquired, although the chip is functionally normal with only the warping, on the result of image processing, it may be erroneously determined to be a defective article with chipping at the four corners. The picking up apparatus according to this embodiment intends to obviate such an inconvenience using the method described below.

First, the sheet with the chip 6 adhered thereon is held on the holding table 4 (see FIG. 1). In this case, since the chip 6 is a low-profile type, the chip 6 has suffered from such warping as to be rolled up at the four corners as described above. Likewise the sheet 5 also follows this warping to be wavy. Then, as seen from FIG. 6A, the suction plane 22a of the sheet 5 separating mechanism 7 is brought into contact with the lower surface of the sheet in the wavy state.

Figure 5A:
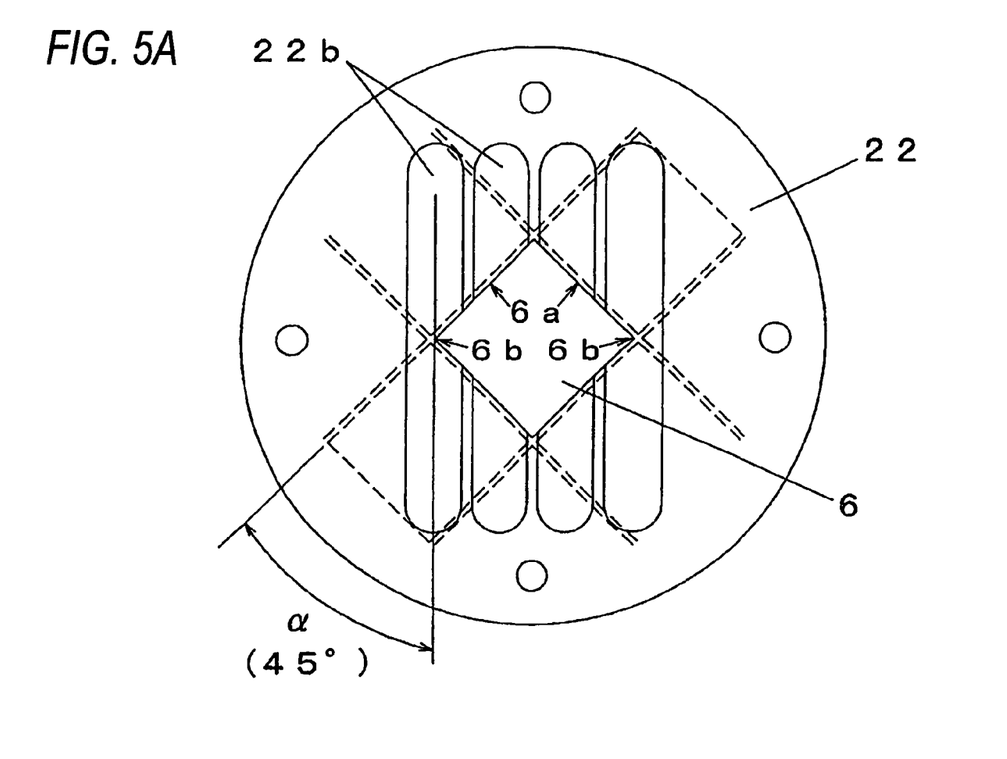
FIGS. 5A and 5B are views for explaining the operation of a semiconductor-chip picking-up method according to an embodiment of the present invention.
Figure 5B:
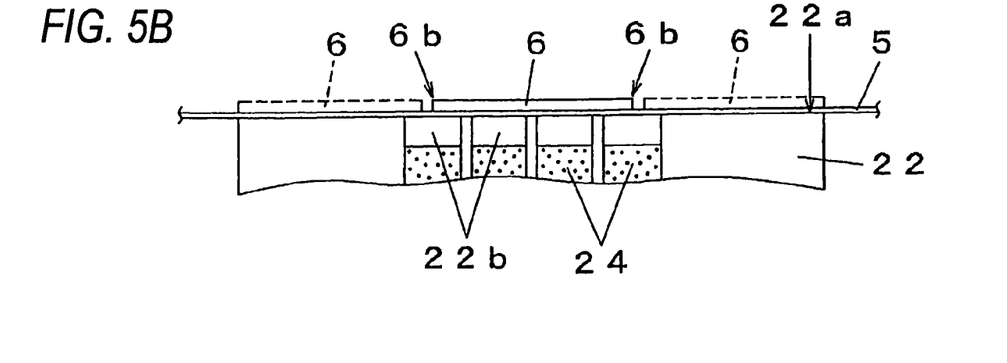

In this case, as seen from FIG. 5, the rotation driving mechanism of the sheet separating mechanism 7 is driven so that the sucking groove 22b is located to form a prescribed angle α (45° in this example) with the side 6a of the chip 6 to be separated, thereby adjusting the rotating angle of the suction separating tool 22.

Further, the position of the sheet separating mechanism 7 relative to the sheet 5 is adjusted so that the corner 6b of the chip 6 is not located immediately above the boundary zone 22d but located approximately midway in the width direction of the sucking groove 22b. Incidentally, in the respective figures of FIG. 5 et seq., among the chips 6 adhered in a matrix shape on the sheet 5, only the chip 6 which is an object of the suction separating operation is illustrated, but the other remaining chips are not illustrated.

Figure 6B:
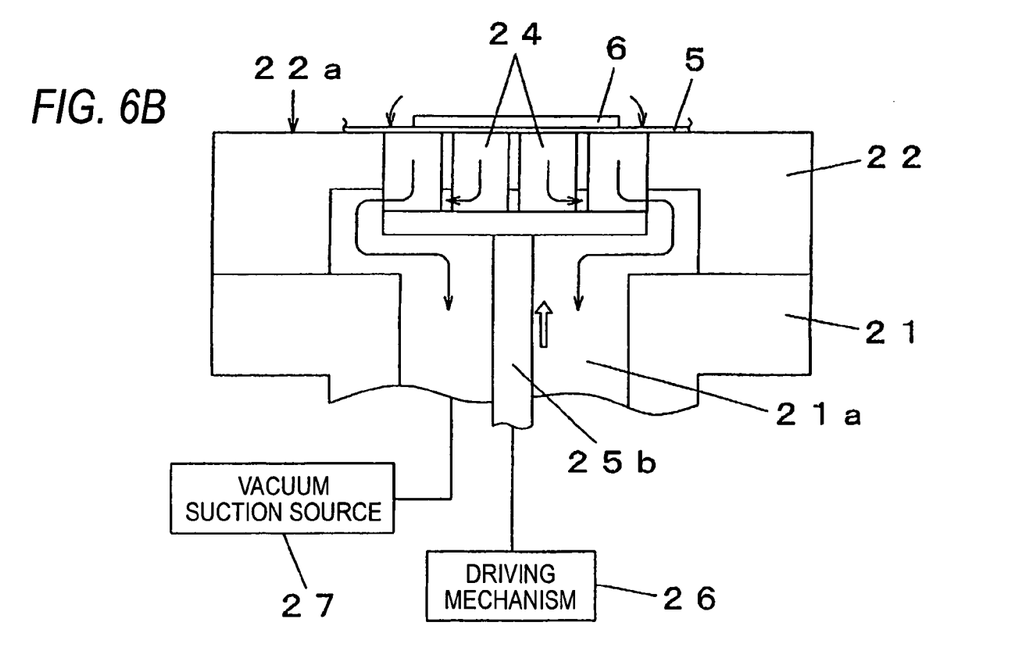

Next, the suction separating operation is performed. First, as seen from FIG. 6B, the vertical driving mechanism 26 is driven to rise the suction members 24 so that the upper surface of the suction members 24 becomes flush with the suction plane 22a. Next, the vacuum sucking source 27 is driven to vacuum-suck the inner hole 21a of the supporting shaft portion 21. Then, as seen from FIG. 6B, the sheet 5 is vacuum sucked to the upper surface of the suction members 24 through the pores existing within the suction members 24 so that the sheet 5 follows the suction plane 22a. Thus, the warping/deformation of the chip 6 adhered on the sheet 5 is reformed and corrected so that the upper surface of the chip 6 inclusive of the four corners is kept planar.

Figure 7A:
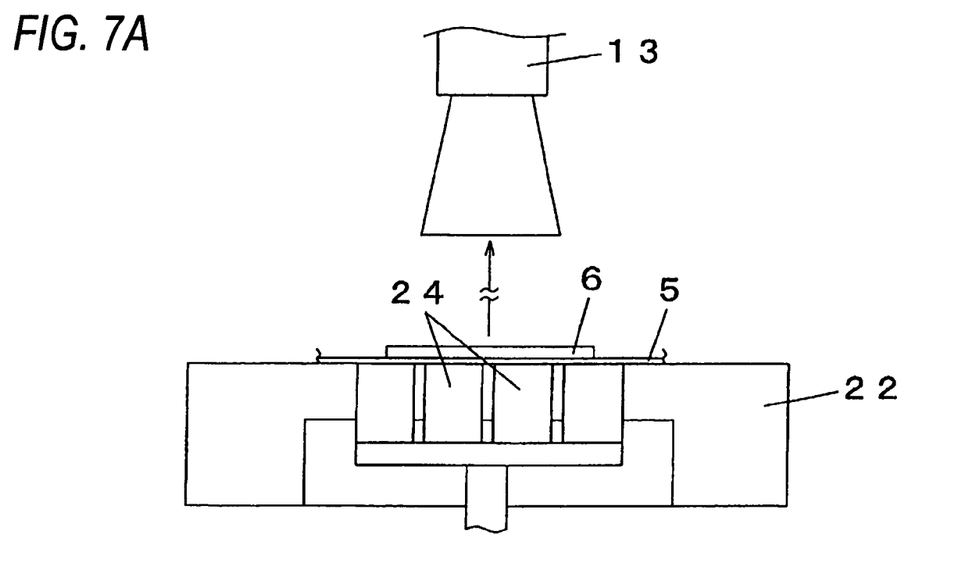
FIGS. 7A and 7B are views for explaining the operation of a semiconductor-chip picking-up method according to an embodiment of the present invention.

Next, the imaging for positioning the chip is carried out. As seen from FIG. 7A, the chip 6 to be picked up is located beneath the camera 13 to image the chip 6 using the camera 13. In this case, since the warping/deformation of the chip 6 has been reformed so that its upper surface is properly planar, erroneous recognition due to poor planarity does not occur, thereby acquiring correct recognition result.

Figure 7B:
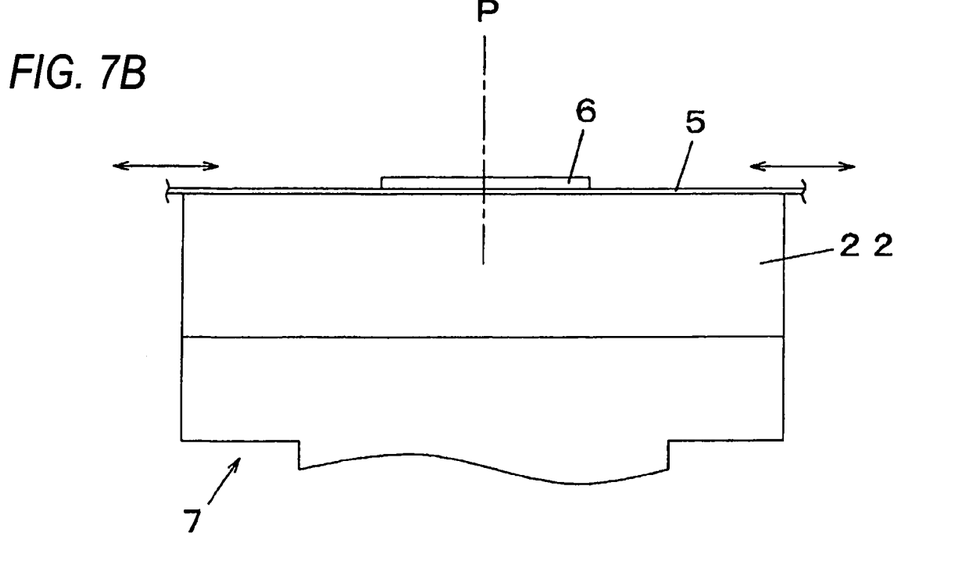

On the basis of the recognition result, the XY table 2 is driven to move the sheet 5 held on the holding table 4 as well as the sheet separating mechanism 7 so that as seen from FIG. 7B, the chip 6 to be picked up is aligned with the position P for the suction by the suction nozzle 8*a*.

Figure 8A:
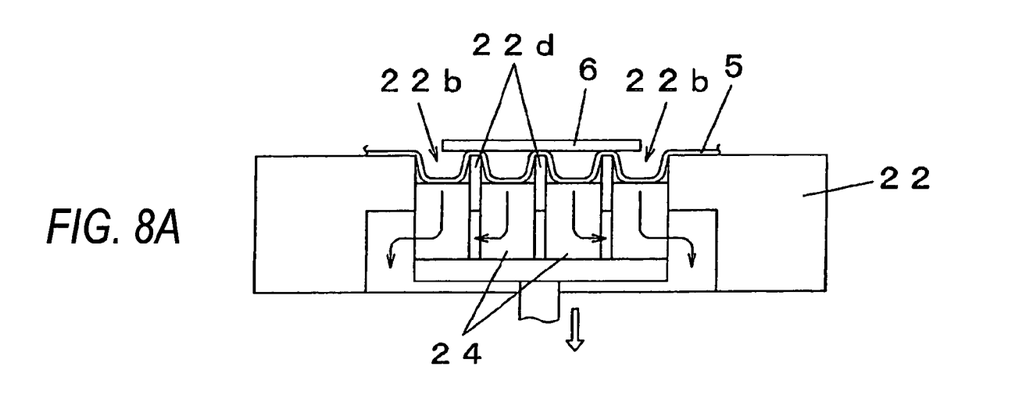
FIGS. 8A and 8B are view for explaining the operation of a semiconductor-chip picking-up method according to an embodiment of the present invention.
Figure 8B:
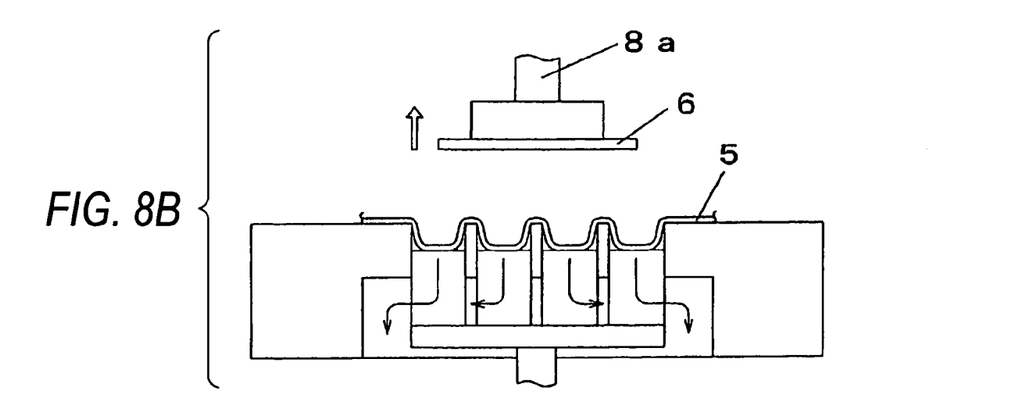

Thereafter, the pick-up method according to the present invention proceeds to a sheet separating step. As seen from FIG. 8A, the suction member 24 is fallen while vacuum sucking is continued. In this case, when the sheet 5 is warped/deformed by continuation of vacuum sucking, the sheet 5 being sucked to the suction members 24 is concaved into the suction grooves 22*b*. Then, the sheet 5 is separated from the chip 6. As a result, the chip 6 which has been deformed returns to the initial state to be substantially horizontal. Further, the suction nozzle 8*a* is moved up and down to take out the chip 6 as shown in FIG. 8B, thereby completing the pick-up of the chip 6.

The pick-up method described above comprises a recognition step of imaging a chip 6 adhered on the sheet 5 to recognize the chip; a positioning step of positioning the chip to be picked up relatively to the pick-up head 8 on the basis of the recognition result in the recognition step; a sheet separating step of separating the sheet 5 from the semiconductor chip 6 by vacuum-sucking the sheet 5 from the plurality of sucking grooves 22*b* formed in the suction plane 22*a* with the suction plane 22*a* of the sheet separating mechanism 7 being kept in contact with the lower surface of the sheet 5; and an suction/holding step of suction/holding the upper surface of the chip 6 with the sheet separated through pick-up using a pick-up head 8.

Prior to the above recognition, the suction members 24 ascendably and descendably fit in the sucking grooves 22*b*, respectively are risen to be brought into contact with the lower surface of the sheet 5 and the sheet 5 is sucked so that the warping/deformation of the chip 6 adhered/held on the sheet 5 is reformed. The sheet-separating step is carried out in a state where the suction members 24 have been fallen. In this sheet separating step, the chip 6 is supported through the sheet 5 by the boundary zones 22*d* separating the adjacent sucking grooves from each other.

Therefore, when an image of the chip 6 is captured for the purpose of alignment at the time of pick-up, it can be held stably with its planarity being assured. Thus, the erroneous recognition due to warping/deformation that owing to partial warping of the semiconductor chip, a conforming product is erroneously regarded as a defective chipping product can be avoided.

In the embodiment described above, the sides 6*a* of the chip 6 were oriented at an angle of 45° from the sucking grooves 22*b* so that the diagonal direction of the chip 6 is aligned with that of the sucking grooves 22*b*. However, according to the combination of conditions such as the rigidity of the chip 6 and sheet 5, width B of each sucking groove 22*b* and vacuum sucking force, the sides of the chip 6 may be oriented at the other angle than 45°.

In the embodiment described above, the holding table 4 was moved with the sheet separating mechanism 7 being fixed in a horizontal direction (XY direction). However, with the holding table 4 being fixed in the horizontal direction (XY direction), the sheet separating mechanism 7 may be moved.

Additionally, in the embodiment described above, with respect to the movement of the suction members 24, the suction members 24 were moved up and down. The movement of the suction members 24 should not be limited to such a movement. The suction members 24 may be moved in such a way that they are slid horizontally, or they are opened/closed at the fulcrum of their one end being fixed. Specifically, the movement means may be any mechanism in which in the recognition step, the suction members 24 are brought into contact with the lower surface of the sheet 5 from below the chip to correct the warping of the chip, and in the sheet separating step, they leave the lower surface of the sheet to allow the chip to be deformed.

In accordance with the present invention, in a sheet separating mechanism for separating the chip from the sheet by vacuum sucking the sheet from a plurality of sucking grooves formed in an suction plane in contact with the lower surface of the sheet, suction members are movably provided in the sucking grooves, respectively so that when they are moved toward the lower surface of the sheet, they are brought into contact with the lower surface of the sheet to suck the sheet. For this reason, the warping/deformation of the chip can be reformed and corrected by suction/holding the chip through the sheet during chip recognition. Thus, the chip recognition can be stabilized to assure alignment accuracy in the pick-up. The pick-up operation can be realized with high productivity without generating inconvenience such as fracture or chipping.

What is claimed is:

1. A chip pick-up method for picking up a chip held on a sheet using a pick-up head, comprising:
   a recognition step of recognizing the chip by capturing an image of the chip held on the sheet;
   a positioning step of positioning the chip to be picked up relatively to the pick-up head on the basis of the recognition result in the recognition step;
   a sheet separating step of separating the sheet from the chip by sucking the sheet from sucking grooves with boundary zones being kept in contact with a lower surface of the sheet, the boundary zones defining a suction plane; and
   a holding step of holding an upper surface of the chip separated from the sheet using the pick-up head, wherein prior to said recognition step, suction members are moved to be brought into contact with the lower surface of the sheet and the sheet is sucked so that the deformation of the chip held on the sheet is reformed, and wherein said sheet separating step is implemented in a state where said suction members have left the suction plane.

2. A chip pick-up method for picking up a chip held on a sheet using a pick-up head, comprising;
   a recognition step of recognizing the chip by capturing an image of the chip held on the sheet;
   a positioning step of positioning the chip to be picked up relatively to the pick-up head on the basis of the recognition result in the recognition step;
   a sheet separating step of separating the sheet from the chip by sucking the sheet from sucking grooves with boundary zones being kept in contact with a lower surface of the sheet, the boundary zones defining a suction plane; and
   a holding step of holding an upper surface of the chip separated from the sheet using the pick-up head, wherein prior to said recognition step, suction members are moved to be brought into contact with the lower surface of the sheet and the sheet is sucked so that the deformation of the chip held on the sheet is reformed, wherein said sheet separating step is implemented in a state where said suction members have left the suction plane, and in said sheet separating step, said chip is supported through the sheet by said boundary zones each of which separates the sucking grooves adjacent to each other.

3. A chip pick-up apparatus comprising:

a pick-up head for picking up a chip held on a sheet;

a holding table for holding the sheet;

a recognition means for recognizing the chip by capturing an image of the chip held on said sheet;

a positioning means for positioning the chip to be picked up relatively to said pick-up head on the basis of the recognition result by said recognition means; and a sheet separating mechanism for separating the sheet from the chip by sucking the sheet from a suction plane brought in contact with the lower surface of the sheet in a state where movable suction members have left a suction plane defined by boundary zones and where the boundary zones separated by sucking grooves support the chip, said sheet separating mechanism being arranged below said holding table, wherein said sheet separating mechanism includes:

a reforming means for reforming deformation of said chip in contact with the lower surface of said sheet; and a separating means for separating the sheet from the chip by deforming said chip.

4. A chip pick-up method for picking up a chip held on a sheet using a pick-up head, comprising:

a recognition step of recognizing the chip by capturing an image of the chip held on the sheet;

a positioning step of positioning the chip to be picked up relatively to the pick-up head on the basis of the recognition result in the recognition step;

a sheet separating step of separating the sheet from the chip by sucking the sheet from sucking grooves, with boundary zones being kept in contact with a lower surface of the sheet, the boundary zones defining a suction plane; and a holding step of holding an upper surface of the chip separated from the sheet using the pick-up head, wherein prior to said recognition step, deformation of said chip held on the sheet is reformed, and in the sheet separating step, said chip is deformed to peel the sheet from the chip, wherein said sheet separating step is implemented in a state where suction members have left the suction plane.

* * * * *